US010123407B2

(12) United States Patent
Shiue

(10) Patent No.: US 10,123,407 B2
(45) Date of Patent: Nov. 6, 2018

(54) TRANSMISSION LINE STRUCTURE HAVING ORTHOGONALLY ORIENTED TRANSMISSION LINE SEGMENTS CONNECTED BY VIAS EXTENDING THROUGH A SUBSTRATE BODY

(71) Applicant: CHUNG YUAN CHRISTIAN UNIVERSITY, Taoyuan (TW)

(72) Inventor: Guang-Hwa Shiue, Taoyuan (TW)

(73) Assignee: CHUNG YUAN CHRISTIAN UNIVERSITY, Taoyuan (TW)

( * ) Notice: Subject to any disclaimer, the term of this patent is extended or adjusted under 35 U.S.C. 154(b) by 99 days.

(21) Appl. No.: 15/293,225

(22) Filed: Oct. 13, 2016

(65) Prior Publication Data

US 2017/0365905 A1  Dec. 21, 2017

(30) Foreign Application Priority Data

Jun. 17, 2016 (TW) .............................. 105119242 A

(51) Int. Cl.
| | | |
|---|---|---|
| H05K 1/02 | (2006.01) | |
| H01P 3/04 | (2006.01) | |
| H01P 3/08 | (2006.01) | |
| H01P 1/203 | (2006.01) | |
| H01P 5/04 | (2006.01) | |
| H01P 9/00 | (2006.01) | |

(52) U.S. Cl.
CPC ....... *H05K 1/0251* (2013.01); *H01P 1/20381* (2013.01); *H01P 3/04* (2013.01); *H01P 3/08* (2013.01); *H01P 3/081* (2013.01); *H01P 5/04* (2013.01); *H01P 9/003* (2013.01); *H05K 1/0245* (2013.01)

(58) Field of Classification Search
CPC ......... H01P 3/04; H01P 3/088; H05K 1/0251; H05K 1/0245
USPC ....................................................... 333/1, 4
See application file for complete search history.

(56) References Cited

U.S. PATENT DOCUMENTS

| | | | |
|---|---|---|---|
| 2010/0214039 A1* | 8/2010 | Lin et al. ............ | H01P 1/20345 333/204 |
| 2012/0243184 A1* | 9/2012 | Lee ...................... | H05K 1/0245 361/737 |

* cited by examiner

*Primary Examiner* — Benny Lee
(74) *Attorney, Agent, or Firm* — Maschoff Brennan

(57) ABSTRACT

A structure of transmission line includes a first transmission line, a second transmission line and an interlayer via. The first transmission line includes a first line segment, a second segment and a first signal via. The second transmission line includes a third line segment, a fourth segment and a second signal via. Both of the first line segment and the third line segment are disposed in a first signal transmission layer and extend along a first direction. Both of the second line segment and the fourth line segment are disposed in a second signal transmission layer and extend along a second direction. The first signal via is connected to the first line segment and the second line segment. The second signal via is connected to the third line segment and the fourth line segment. The interlayer via is adjacent to the first line segment or the second line segment.

8 Claims, 6 Drawing Sheets

US 10,123,407 B2

TRANSMISSION LINE STRUCTURE HAVING ORTHOGONALLY ORIENTED TRANSMISSION LINE SEGMENTS CONNECTED BY VIAS EXTENDING THROUGH A SUBSTRATE BODY

CROSS-REFERENCE TO RELATED APPLICATIONS

This non-provisional application claims priority under 35 U.S.C. § 119(a) on Patent Application No(s). 105119242 filed in Taiwan, R.O.C. on Jun. 17, 2016, the entire contents of which are hereby incorporated by reference.

TECHNICAL FIELD

The disclosure relates to a structure of a transmission line, more particularly to a structure of a transmission line having a plurality of signal transmission layers and vias.

BACKGROUND

When the age of the high-speed digital signal communication comes, the transmission of the high-speed digital signal plays an important role. Besides the increasing demand of operating frequencies and frequency bands of signals, the trend of precision designs of technology products also leads to the increasing of layout densities of print circuit boards. Therefore, problems related to signal integrity, electromagnetic interference, electromagnetic compatibility or power integrity during the signal transmission appear. The most significant one of the problems which are related to the signal transmission is the effect of the common mode noise caused by the high layout densities of print circuit boards.

SUMMARY OF THE INVENTION

According to one embodiment, the structure of the transmission line is adapted for a substrate having a body, a first signal transmission line and a second signal transmission line. The first signal transmission layer and the second signal transmission layer are disposed in parallel and insulated from each other. The structure of the transmission line includes a first transmission line, a second transmission line and at least one inter-layer via. The first transmission line includes a first line segment, a second line segment and a first signal via. The first line segment is disposed in the first signal transmission layer and extends along the first direction. The second line segment is disposed in the second signal transmission layer and extends along the second direction. The first direction is perpendicular to the second direction. The first signal via is disposed in the body and perpendicular to the first signal transmission layer. The first signal via is connected to the first line segment and the second line segment. The second transmission line includes a third line segment, a fourth line segment and a second signal via. The third line segment is disposed in the first signal transmission layer and extends along the first direction. An orthogonal projection of the second line segment onto the first signal transmission layer partially overlaps the third line segment. The fourth line segment is disposed in the second signal transmission layer and extends along the second direction. The second signal via is disposed in the body and perpendicular to the first signal transmission layer. The second signal via is connected to the third line segment and the fourth line segment. The inter-layer via is adjacent to the first line segment or the third line segment and disposed within a preset distance from the first signal via. The inter-layer via is perpendicularly connected to the first signal transmission layer and the second signal transmission layer.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION OF THE INVENTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
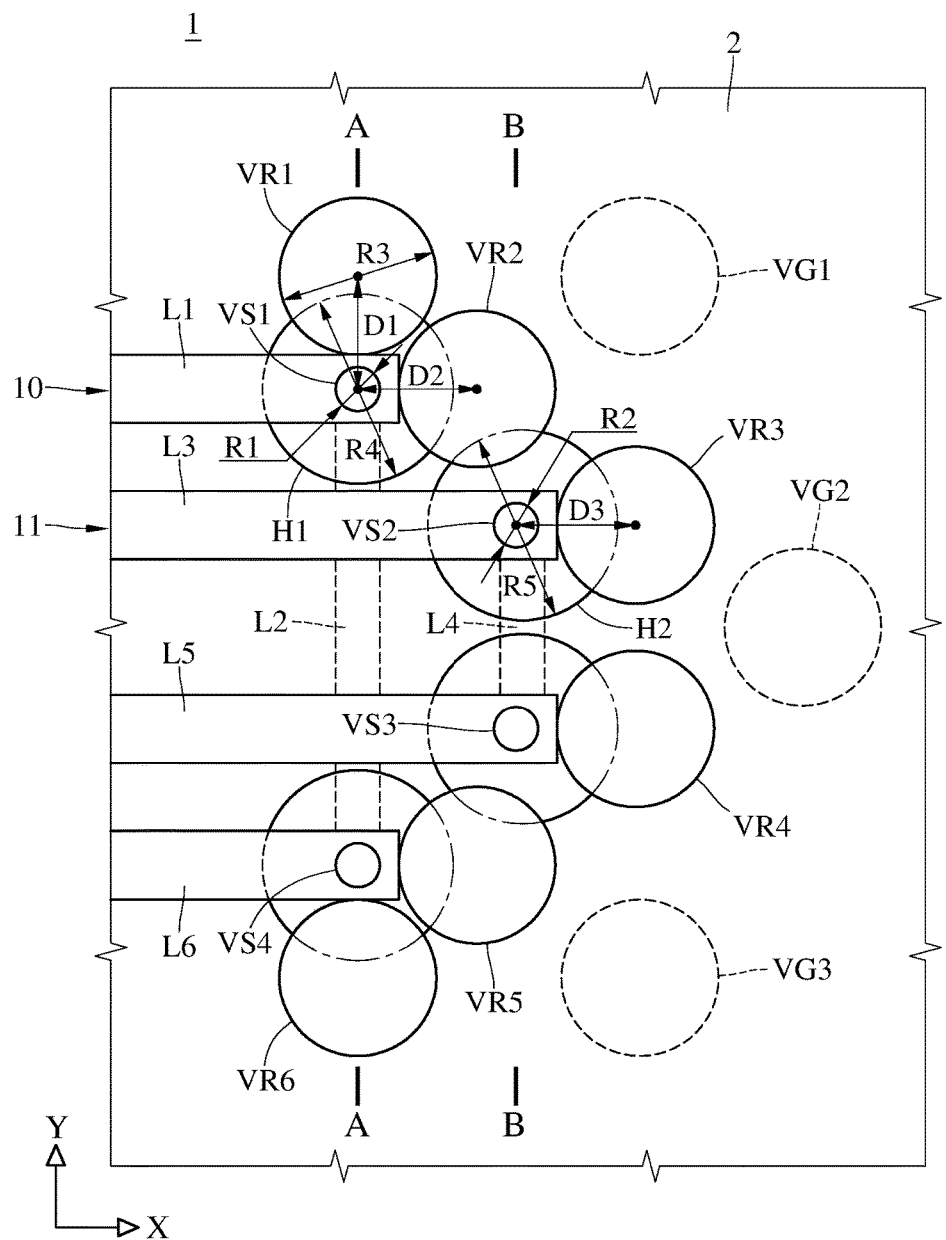
FIG. 1 is a top view diagram of a structure of a transmission line in one embodiment.
Figure 2:
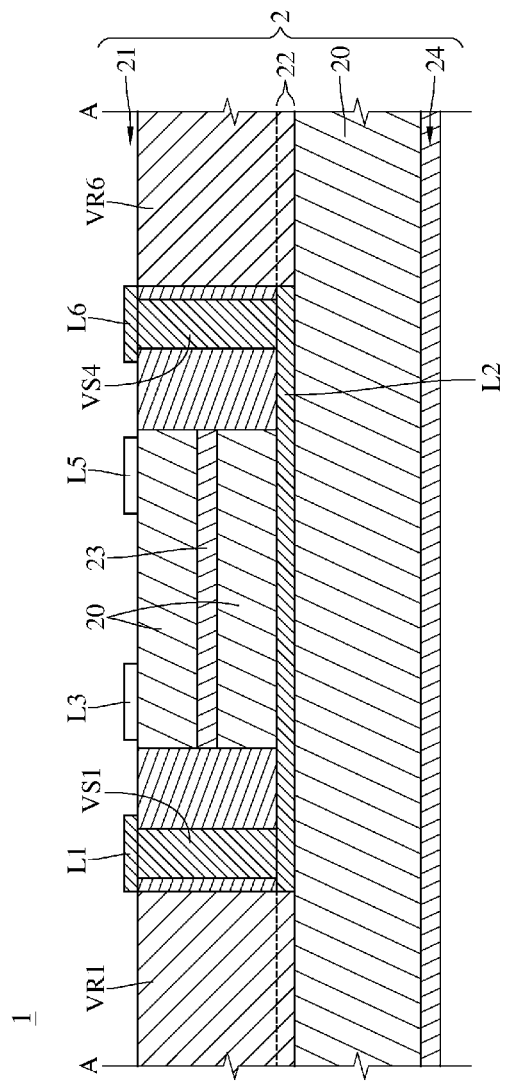
FIG. 2 is a cross-section diagram of the structure of the transmission line in the embodiment of FIG. 1.

Please refer to FIG. 1 and FIG. 2. FIG. 1 is a top view diagram of a structure of a transmission line in one embodiment. FIG. 2 is a cross-section diagram of the structure of the transmission line in the embodiment of FIG. 1 corresponding to a section line AA shown in FIG. 1. As shown in FIG. 1 and FIG. 2, a transmission line 1 is disposed in the substrate 2. The substrate 2 has a body 20, a first signal transmission layer 21 and the second signal transmission layer 22 as shown in FIG. 2. In the embodiment as shown in FIG. 2, the first signal transmission layer 21 is above the substrate 2, and the second signal transmission layer 22 is in the substrate 2. In another embodiment, both the first signal transmission layer 21 and the second signal transmission layer 22 are in the substrate 2. The structure of the transmission line 1 includes a first transmission line 10 (FIG. 1), a second transmission line 11 (FIG. 1) and a plurality of inter-layer vias VR1 and VR2 (FIG. 1). The first transmission line 10 includes a first line segment L1, a second line segment L2 and a first signal via VS1. The first line segment L1 is disposed in the first signal transmission layer 21 and extends along the first direction (in parallel with X axis as shown in FIG. 1). The second line segment L2 is disposed in the second signal transmission layer 22 and extends along the second direction (in parallel with Y axis as shown in FIG. 1). The first direction is perpendicular to the second direction. The first signal via VS1 is disposed in the body 20 and perpendicular to the first signal transmission layer 21. The first signal via VS1 is connected to the first line segment L1 and the second line segment L2.

Figure 3:
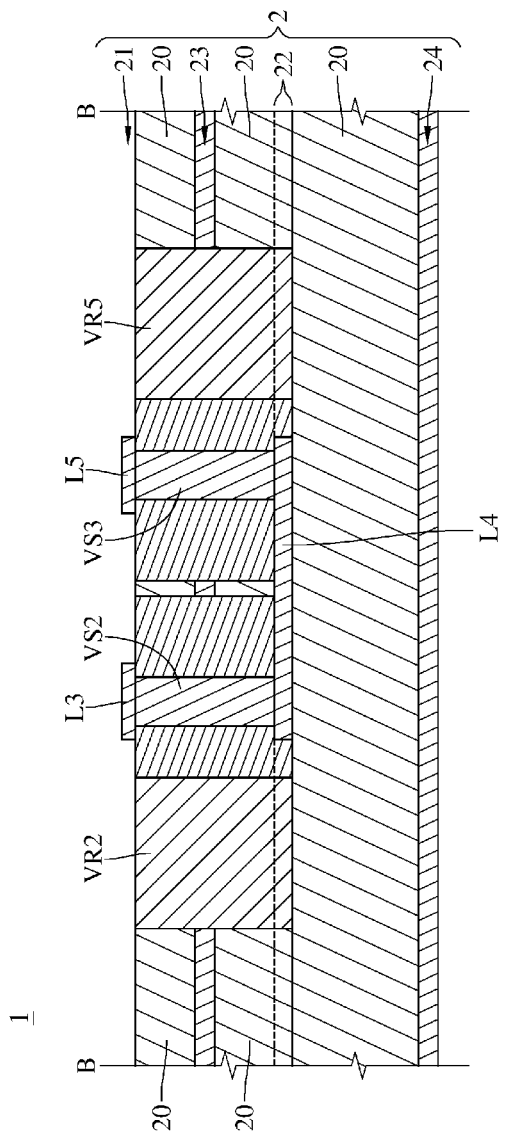
FIG. 3 is a cross-section diagram of the structure of the transmission line in the embodiment of FIG. 1.

The second transmission line 11 includes a third line segment L3, a fourth line segment L4 (FIG. 1) and a second signal via VS2 (FIG. 1). The third line segment L3 is disposed in the first signal transmission layer 21 and extends along the first direction. An orthogonal projection of the second line segment L2 onto the first signal transmission layer 21 is partially overlapping with the third line segment L3. In one embodiment, an orthogonal projection of the fourth line segment L4 onto the first signal transmission layer 21 is not overlapping with the first line segment L1. Please refer to FIG. 1, FIG. 2 and FIG. 3. FIG. 3 is a cross-section diagram of the structure of the transmission line in the embodiment of FIG. 1 corresponding to a section line BB shown in FIG. 1. As shown in FIG. 1, FIG. 2 and FIG. 3, the fourth line segment L4 is disposed in the second signal transmission layer 22 (FIGS. 2 and 3) and extends along the second direction. The second signal via VS2 (FIGS. 1 and 3) is disposed in the body 20 (FIGS. 2 and 3) and perpendicular to the first signal transmission layer 21. The second signal via VS2 is connected to the third line segment L3 and the fourth line segment L4 as shown in FIG. 3. In one example, both the first signal via VS1 and the second signal via VS2 (FIGS. 1 and 3) consist of materials for transmitting signals such as metals.

The inter-layer via VR1 is adjacent to the first line segment L1. The distance between the inter-layer via VR1 and the first signal via VS1 is a distance D1 (FIG. 1) less than a preset distance which is predetermined. In one embodiment, the inter-layer via VR2 (FIGS. 1 and 3) is adjacent to the first line segment L1. The distance between the inter-layer via VR2 and the first signal via VS1 is a distance D2 (FIG. 1) less than the preset distance. For example, if the preset distance is 18 mil, and then both the distance D1 and the distance D2 are less than 18 mil. The unit "mil" refers to a thousandth of an inch. Specifically, the distance (less than the preset distance) between the inter-layer via VR1 and the first signal via VS1 is close, and the distance (less than the preset distance) between the inter-layer via VR2 and the first signal via VS1 is close. Both the inter-layer via VR1 and the inter-layer via VR2 are disposed near to the junction of the first line segment L1 and the second line segment L2. Both the inter-layer via VR1 and the inter-layer via VR2 are perpendicularly connected to the first signal transmission layer 21 and the second signal transmission layer 22.

In one example, as shown in FIG. 1, the distance D1 is the distance between the center of the inter-layer via VR1 and the center of the first signal via VS1. The distance D2 is the distance between the center of the inter-layer via VR2 and the center of the first signal via VS1. In another embodiment, the inter-layer via VR3 is adjacent to the third line segment L3. The distance between the inter-layer via VR3 and the second signal via VS2 is a distance D3 less than the preset distance. Both the first signal transmission layer 21 and the second signal transmission layer 22 are disposed in the body 20. The body 20 has a first dielectric coefficient. The first signal transmission layer 21 and the second signal transmission layer 22 are disposed in parallel. The first signal transmission layer 21 is insulated from the second signal transmission layer 22. In one embodiment, the body 20 consists of insulating materials for insulating conductive layers so that signals could be transmitted normally in the body 20.

In one embodiment, the inter-layer via VR1 has a second dielectric coefficient less than the first dielectric coefficient. For example, the second dielectric coefficient of the inter-layer via VR1 is 3.2, and the first dielectric coefficient of the body 20 is 4.4. In another embodiment, the inter-layer via VR1 is an air via. The air via has the second dielectric coefficient which is 1. The dielectric coefficients mentioned in the above embodiment are merely used for illustration. The present disclosure covers all situations that the second dielectric coefficient of the inter-layer via VR1 is less the first dielectric coefficient of the body 20. In one embodiment, the first signal via VS1 has a first diameter R1, and the second signal via VS2 has a second diameter R2. The inter-layer via VR1 has a third diameter R3. Both the first diameter R1 and the second diameter R2 are less than the third diameter R3. In one embodiment, both the first diameter R1 and the second diameter R2 are one third of the third diameter R3. For example, when both the first diameter R1 and the second diameter R2 are 3 mil, the third diameter R3 is 9 mil. However, the present disclosure is not limited to the above embodiments.

In one embodiment of the present disclosure, as shown in FIG. 2 and FIG. 3, the substrate 2 further includes the first grounding layer 23 and the second grounding layer 24. The first grounding layer 23 is between the first signal transmission layer 21 and the second signal transmission layer 22. The second signal transmission layer 22 is between the first grounding layer 23 and the second grounding layer 24. In one embodiment, the structure of the transmission line 1 further includes grounding vias VG1~VG3 (FIG. 1) perpendicular to the first grounding layer 23 and the second grounding layer 24. In one example, the first signal transmission layer 21 is isolated from the second signal transmission layer 22 by the first grounding layer 23 so that the signal transmissions would not be affected by the capacitive coupling between the line segments of the first signal transmission layer 21 and the line segments of the second signal transmission layer 22. As shown in FIG. 1, the first grounding layer 23 (FIGS. 2 and 3) has the first through hole H1 corresponding to the first signal via VS1 and the second through hole H2 corresponding to the second signal via VS2. In other words, the first signal via VS1 is disposed in the first through hole H1, and the second signal via VS2 is disposed in the second through hole H2.

In one embodiment as shown in FIG. 1, the first through hole H1 has a fourth diameter R4, and the second through hole H2 has a fifth diameter R5. The fourth diameter R4 is greater than the first diameter R1 of the first signal via VS1, and the fifth diameter R5 is greater than the second diameter R2 of the second signal via VS2. Through the setups of the first through hole H1 and the second through hole H2, the first signal via VS1 would not contact the first grounding layer 23, and the second signal via VS2 would not contact the second grounding layer 24 (FIGS. 2 and 3). In one embodiment, the fourth diameter R4 of the first through hole H1 is four times the first diameter R1 of the first signal via VS1, and the fifth diameter R5 of the second through hole H2 is four times the second diameter R2 of the second signal via VS2. For example, if both the fourth diameter R4 of the first through hole H1 and the fifth diameter R5 of the second through hole H2 are 12 mil, and then both the first diameter R1 of the first signal via VS1 and the second diameter R2 of the second signal via VS2 are 3 mil. However, the above embodiments are mentioned merely for illustration, and the present disclosure is not limited to the diameters of the above embodiments.

In one embodiment, as shown in FIG. 1, the first transmission line 10 further includes the sixth line segment L6 and the fourth signal via VS4. The second transmission line 11 further includes the fifth line segment L5 and the third signal via VS3. Both the fifth line segment L5 and the sixth line segment L6 are disposed in the first signal transmission layer 21 and extend along the first direction. The fifth line segment L5 is also shown in FIGS. 2-3. The fourth signal via VS4 and the sixth line segment L6 are shown in FIG. 2. The third signal via VS3 is also shown in FIG. 3. The third signal via VS3 is disposed in the body 20 and perpendicular to the first signal transmission layer 21. The third signal via VS3 is connected to the fourth line segment L4 and the fifth line segment L5. The fourth signal via VS4 is disposed in the body 20 and perpendicular to the first signal transmission layer 21. The fourth signal via VS4 is connected to the second line segment L2 and the sixth line segment L6. The inter-layer via VR4 is adjacent to the fifth line segment L5. The inter-layer via VR5 is adjacent to the fifth line segment L5 and the sixth line segment L6. The inter-layer via VR6 is adjacent to the sixth line segment L6. The inter-layer via VR6 is also shown in FIG. 2, and the inter-layer via VR5 is also shown in FIG. 3. The distances and the relative positions between the inter-layer via VR4~VR6, the third signal via VS3 and the fourth signal via VS4 are the same and symmetric as the distances and the relative positions between the inter-layer via VR1~VR3, the first signal via VS1 and the second signal via VS2, so they are not repeated here.

In general, a pair of differential mode signal transmission lines on a printed circuit board have bending structures due to actual demands of layouts. When signals are transmitted through the bending structures of the pair of differential mode signal transmission lines, the common mode noise would be generated because of the timing differences of signals caused by the difference between the distance of an outer bending structure of the bending structures and the distance of an inner bending structure of the bending structures. In the structure of the transmission line 1 of the present disclosure, the first line segment L1, the second line segment L2 and the sixth line segment L6 all connected together as a signal path through the setups of the first signal via VS1 and the second signal via VS2. Through the setups of the second signal via VS2 and the third signal via VS3, the third line segment L3, the fourth line segment L4 and the fifth line segment L5 all connected together as another signal path. When the first transmission line 10 and the second transmission line 11 receive signals, the signals can be transmitted between different transmission layers (the first signal transmission layer 21 and the second signal transmission layer 22) so that the effects of the common mode noise is decreased.

For example, when the first line segment L1 and the third line segment L3 each disposed in the first signal transmission layer 21 receive a set of signals, the set of signals is respectively transmitted to the second line segment L2 and the fourth line segment L4 of the second signal transmission layer 22 through the first signal via VS1 and the second signal via VS2. The set of signals is further respectively transmitted back to the fifth line segment L5 and the sixth line segment L6 of the first signal transmission layer 21 through the third signal via VS3 and the fourth signal via VS4. All of the first line segment L1, the third line segment L3, the fifth line segment L5 and the sixth line segment L6 are microstrip lines, and the second line segment L2 and the fourth line segment L4 both are strip lines. Because the signal transmission speed in the micro-strip lines is higher than in the strip lines, the timing differences caused by the bending structures of the transmission line could be compensated through differences between the transmission speed in the micro-strip lines and the transmission speed in the strip lines. Therefore the common mode noise could be decreased.

Nevertheless, because both the first signal via VS1 and the second signal via VS2 have the capacitive effects, the impedances of the first signal via VS1 and the second signal via VS2 are lower than the impedances of other line segments. Therefore, the impedances of the first signal via VS1 and the second signal via VS2 do not match the impedances of other line segments. During the signal transmission, unmatched impedances will lead to reflections of the signal so that the efficiency of the signal transmission is decreased. In the structure of the transmission line 1, the setups of the inter-layer via VR1~VR6 make the capacitive effects of the first signal via VS1, the second signal via VS2, the third signal via VS3 and the fourth signal via VS4 decrease so that the impedances is raised and the impedances become matched.

For example, assume the impedances of the first signal via VS1 and the second signal via VS2 are 26 ohms before the inter-layer via VR1~VR6 are disposed in the structure of the transmission line 1. The impedances of the first signal via VS1 and the second signal via VS2 will be increased to 50 ohms after the inter-layer via VR1~VR6 are disposed in the structure of the transmission line 1. Therefore, the impedances of the first signal via VS1 and the second signal via VS2 are similar to the impedances of other line segments so that the impedances become matched. In one embodiment, the shapes of the inter-layer via VR1~VR6 could be other types of shapes such as polygons. In a practical example, beside the inter-layer via VR1~VR6, the structure of the transmission line 1 further includes the inter-layer vias adjacent to the first line segment L1, the second line segment L2, the fifth line segment L5 and the sixth line segment L6 so that the impedances become matched more significantly.

Figure 4:
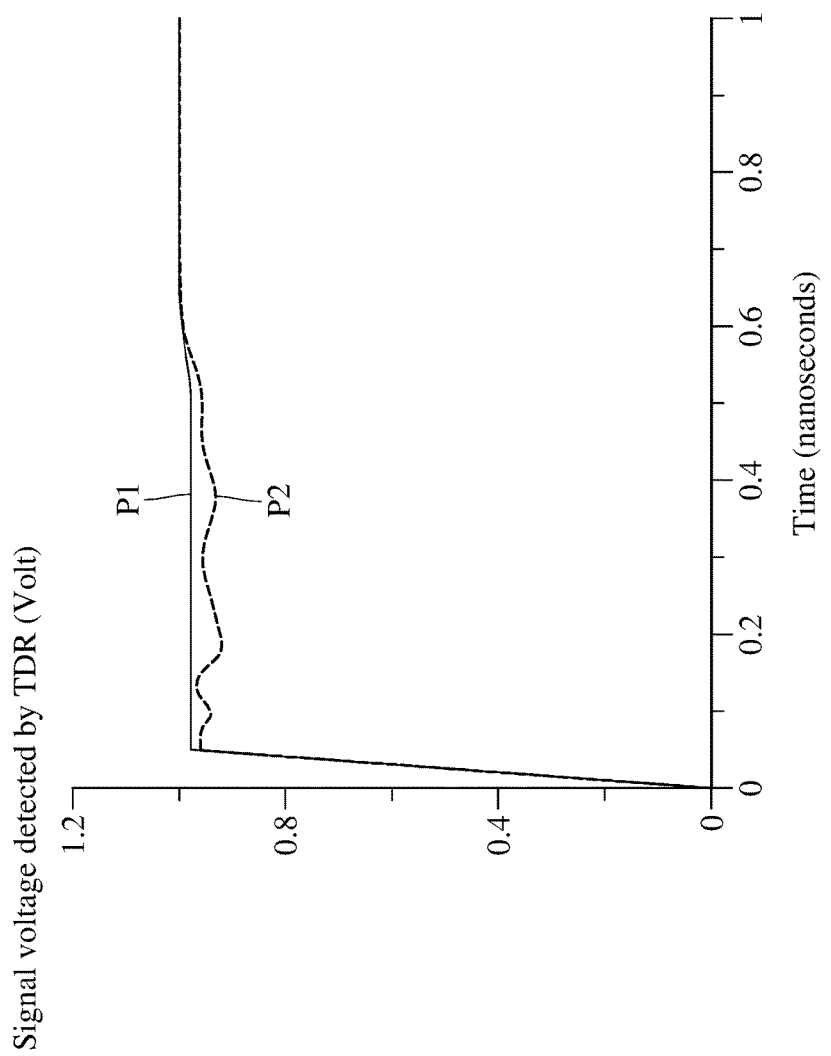
FIG. 4 is a waveform diagram of signals detected by a time domain reflectometer.

Please refer to FIG. 4. FIG. 4 is a waveform diagram of signals detected by a time domain reflectometer. The horizontal axis of FIG. 4 labels time in nanoseconds and the vertical axis labels a signal voltage in volts detected by the time domain reflectometer (i.e. TDR). The signal voltage is configured to indicate reflections of signals in the transmission line. The time domain reflectometer (TDR) is configured to determine the impedance of the transmission line by detecting the reflections of the signals in the transmission line. The curve shown in FIG. 4 could reflect the discontinuity of impedances caused by parasitic capacitances in the transmission line. In other words, when impedances of the transmission line become unmatched, the waveform detected by the time domain reflectometer is unstable. When impedances of the transmission line become matched, the waveform detected by the time domain reflectometer is stable. The curve P1 in FIG. 4 indicates the time domain reflection of signals in the structure of the transmission line 1 (the inter-layer via VR1~VR6 are not disposed). The curve P2 indicates the time domain reflection of signals in the structure of the transmission line 1 (the inter-layer via VR1~VR6 are disposed). As shown in FIG. 4, the waveform of the curve P1 is significantly unstable, and it represents the impedances of the transmission line are not matched. Specifically, the setups of signal vias make the impedances of the transmission line unmatched so that the curve P1 indicates the waveform is significantly concave from the 0.2 nanoseconds to the 0.45 nanoseconds. On the contrast, the curve P2 indicates the waveform is significantly stable, and it represents the impedances of the transmission line are matched. In other words, the inter-layer vias disposed in the structure of the transmission line 1 increase the impedances so that the effects of the unmatched impedances of the transmission line are decreased.

Figure 6:
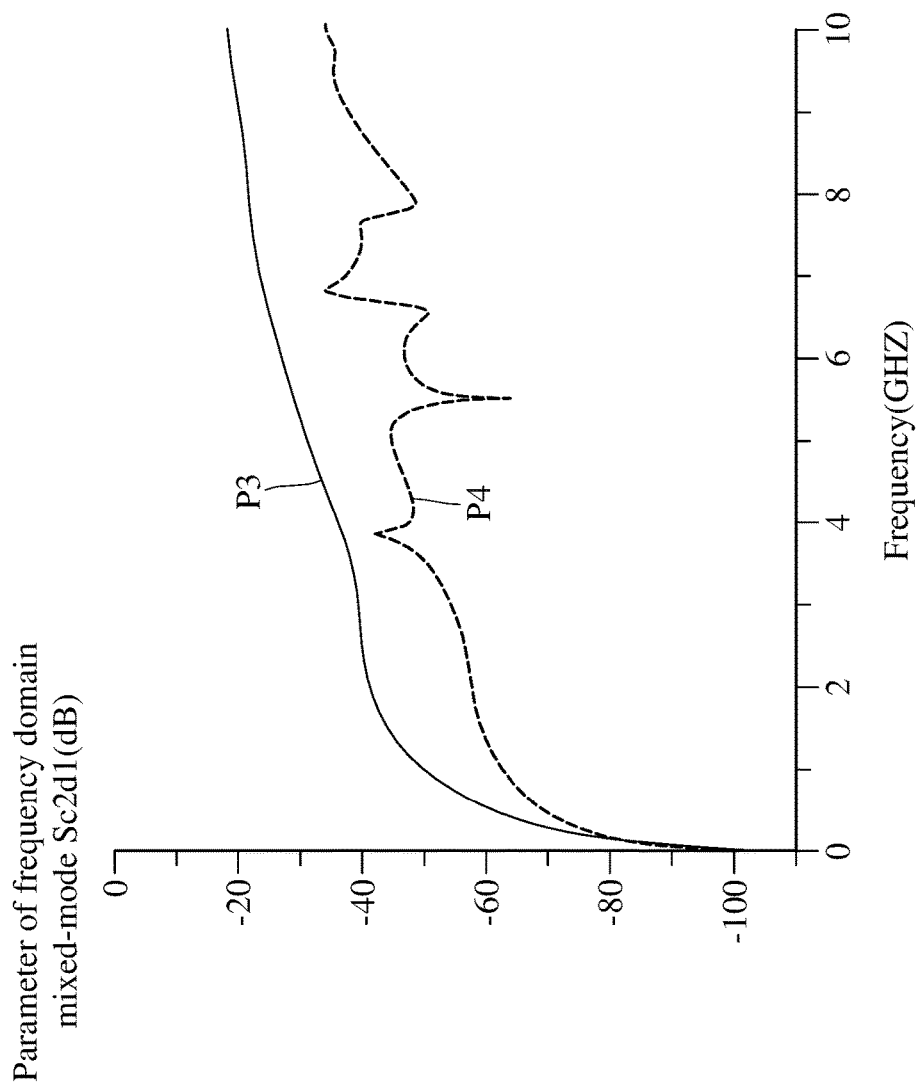
FIG. 6 is a waveform diagram of frequency domain mixed-mode.

Please refer to FIG. 1 and FIG. 6. FIG. 6 is a waveform diagram of frequency domain mixed-mode. As shown in FIG. 6, the horizontal axis labels frequency in GHz, and the vertical axis labels parameter of frequency domain mixed-mode Sc2d1. The equation is expressed as:

$$Sc2d1 = 20\log\left|\frac{Vc2}{Vd1}\right|$$

Figure 5:
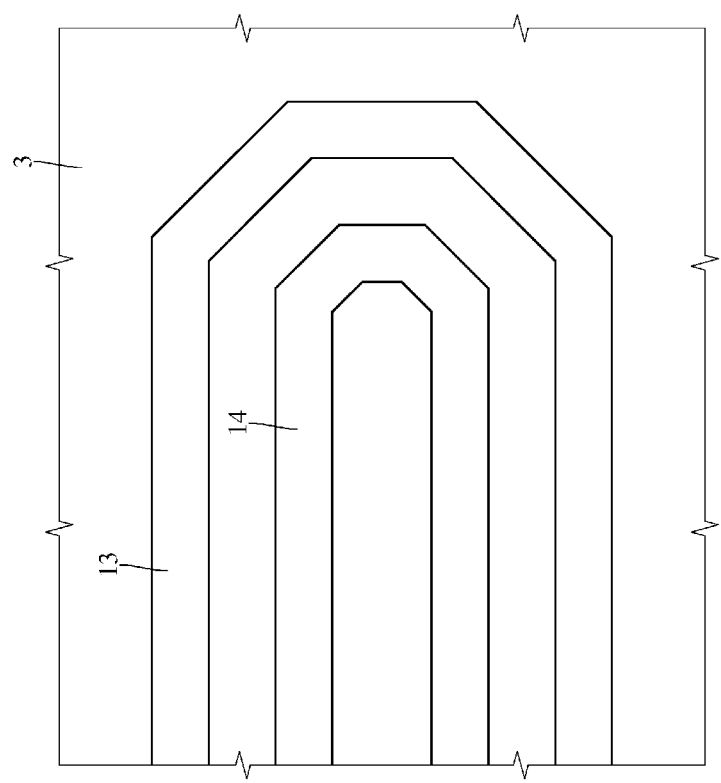
FIG. 5 is a schematic diagram of the structure of the transmission line according to the present technology.

Taking FIG. 1 for example, the voltage Vd1 is the input voltage received by the first transmission line 10 and the second transmission line 11. The voltage Vc2 is the common-mode voltage generated by the first transmission line 10 and the second transmission line 11. As indicated in the above equation, the parameter of frequency domain mixed-mode Sc2d1 increases when the voltage Vd1 is fixed and the voltage Vc2 increases. Therefore, the curve moves toward the upside of the waveform diagram. Please refer to FIG. 5. FIG. 5 is a schematic diagram of the structure of the transmission line according to the present technology. As shown in FIG. 5, both the third transmission line 13 and the fourth transmission line 14 are disposed on the substrate 3, and both the third transmission line 13 and the fourth transmission line 14 do not have a plurality of signal transmission layers. The layout of the transmission line in FIG. 5 has bending structures. The curve P3 represents the variance of frequency domain mixed-mode Sc2d1 based on the structure of the transmission line shown in FIG. 5. The curve P4 represents the variance of frequency domain mixed-mode Sc2d1 based on the structure of the transmission line 1 shown in FIG. 1. As shown in FIG. 6, the curve P4 is below the curve P3. As shown in FIG. 1, it is indicated that the structure of the transmission line 1 could decease the effects of common-mode signal. In other word, comparing to the structure of the transmission line (without a plurality of signal transmission layers) in FIG. 5, the signal in the structure of the transmission line 1 in FIG. 1 could reaches the timing synchronization through the differences between the transmission speed in the microstrip lines and the transmission speed in the strip lines, and the differences of transmission distances, so that the effects of common-mode signal is decreases. Therefore, the effects of common-mode signal are deceased.

Based on the above description, in the structure of the transmission line, the signals could become timing synchronized through the differences between the transmission speed in the line segments of the first signal transmission layer and the transmission speed in the line segments of the second signal transmission layer, and the different transmission distances of different signal transmission layers so that common mode noise could be decreased. The inter-layer vias in the structure of the transmission line could reduce the effects of unmatched impedances caused by signal transmission between signal transmission layers and the signal vias.

What is claimed is:

1. A structure of a transmission line adapted for a substrate having a body, a first signal transmission layer, a second signal transmission layer, wherein the first signal transmission layer and the second signal transmission layer are disposed in parallel and insulated from each other, the structure of the transmission line, comprising:

a first transmission line, comprising:
a first line segment disposed in the first signal transmission layer and extending along a first direction;
a second line segment disposed in the second signal transmission layer and extending along a second direction perpendicular to the first direction; and
a first signal via disposed in the body and perpendicular to the first signal transmission layer and connected to the first line segment and the second line segment;
a second transmission line, comprising:
a third line segment disposed in the first signal transmission layer and extending along the first direction and partially overlapped by an orthogonal projection of the second line segment onto the first signal transmission layer;
a fourth line segment disposed in the second signal transmission layer and extending along the second direction; and
a second signal via disposed in the body and perpendicular to the first signal transmission layer and connected to the third line segment and the fourth line segment; and
at least one inter-layer via adjacent to the first line segment or the third line segment and disposed within a predetermined distance from the first signal via and perpendicularly connected to the first signal transmission layer and the second signal transmission layer;
wherein both the first signal transmission layer and the second signal transmission layer are disposed in the body, and the body has a first dielectric coefficient, and
wherein the at least one inter-layer via has a second dielectric coefficient less than the first dielectric coefficient.

2. The structure of the transmission line according to claim 1, wherein an orthogonal projection of the fourth line segment onto the first signal transmission layer is not overlapping with the first line segment.

3. The structure of the transmission line according to claim 1, wherein the at least one inter-layer via is an air via.

4. A structure of a transmission line adapted for a substrate having a body, a first signal transmission layer, a second signal transmission layer, wherein the first signal transmission layer and the second signal transmission layer are disposed in parallel and insulated from each other, the structure of the transmission line, comprising:

a first transmission line, comprising:
a first line segment disposed in the first signal transmission layer and extending along a first direction;
a second line segment disposed in the second signal transmission layer and extending along a second direction perpendicular to the first direction; and
a first signal via disposed in the body and perpendicular to the first signal transmission layer and connected to the first line segment and the second line segment;
a second transmission line, comprising:
a third line segment disposed in the first signal transmission layer and extending along the first direction and partially overlapped by an orthogonal projection of the second line segment onto the first signal transmission layer;
a fourth line segment disposed in the second signal transmission layer and extending along the second direction; and
a second signal via disposed in the body and perpendicular to the first signal transmission layer and connected to the third line segment and the fourth line segment; and at least one inter-layer via adjacent to the first line segment or the third line segment and disposed within a predetermined distance from the first signal via and perpendicularly connected to the first signal transmission layer and the second signal transmission layer;

wherein both the first signal transmission layer and the second signal transmission layer are disposed in the body, and the body has a first dielectric coefficient;

wherein the first signal via has a first diameter, the second signal via has a second diameter, the at least one inter-layer via has a third diameter, the first diameter and the second diameter are both less than the third diameter.

5. The structure of the transmission line according to claim 4, wherein the first diameter and the second diameter are both one third of the third diameter.

6. The structure of the transmission line according to claim 4, wherein the substrate further has a first grounding layer and a second grounding layer, the first grounding layer is between the first signal transmission layer and the second signal transmission layer, the first grounding layer has a first through hole corresponding to the first signal via and a second through hole corresponding to the second signal via, and the second signal transmission layer is between the first grounding layer and the second grounding layer.

7. The structure of the transmission line according to claim 6, wherein the first through hole has a fourth diameter, the second through hole has a fifth diameter, the fourth diameter is four times the first diameter, and the fifth diameter is four times the second diameter.

8. The structure of the transmission line according to claim 6, further comprising:

a plurality of grounding vias perpendicularly connected to the first grounding layer and the second grounding layer.

\* \* \* \* \*

UNITED STATES PATENT AND TRADEMARK OFFICE
CERTIFICATE OF CORRECTION

PATENT NO. : 10,123,407 B2
APPLICATION NO. : 15/293225
DATED : November 6, 2018
INVENTOR(S) : Guang-Hwa Shiue Page 1 of 1

It is certified that error appears in the above-identified patent and that said Letters Patent is hereby corrected as shown below:

On the Title Page

In Item (54), and in the Specification, in Column 1, Line 1, delete "TRANSMISSION LINE STRUCTURE HAVING ORTHOGONALLY ORIENTED TRANSMISSION LINE SEGMENTS CONNECTED BY VIAS EXTENDING THROUGH A SUBSTRATE BODY" and insert -- STRUCTURE OF TRANSMISSION LINE --, therefor.

Signed and Sealed this
Sixth Day of August, 2019

Andrei Iancu
*Director of the United States Patent and Trademark Office*